Jan. 5, 1960 B. S. PARMET ET AL 2,920,198

RESTORABLE FINE TUNER

Filed Jan. 11, 1957 3 Sheets-Sheet 1

INVENTORS.
Bernard S. Parmet,
BY Harold Tyzack
Mueller & Aichele
Attys.

INVENTORS.
Bernard S. Parmet,
BY Harold Tyzack,
Mueller & Aichele
Attys.

RESTORABLE FINE TUNER

Filed Jan. 11, 1957 3 Sheets-Sheet 3

INVENTORS.
Bernard S. Parmet,
BY Harold Tyzack,
Mueller & Aichele
Att'ys.

United States Patent Office 2,920,198
Patented Jan. 5, 1960

2,920,198

RESTORABLE FINE TUNER

Bernard S. Parmet, Elmwood Park, and Harold Tyzack, Schiller Park, Ill., assignors to Motorola, Inc., Chicago, Ill., a corporation of Illinois Application January 11, 1957, Serial No. 633,599

8 Claims. (Cl. 250—40)

This invention relates to wave signal tuning apparatus and more particularly to the fine tuner of a television receiver.

Many television receivers are tunable to the various VHF channels, namely, channels 2–13, by means of a switch device each position of which couples a preset tuning circuit to the receiver. However, since the setting of these tuning circuits is quite critical, and may change slightly with aging of the receiver components, temperature conditions, and the like, there is generally a fine tuning provision of peaking up the tuning, usually of the tuned circuit in the local oscillator, for each television channel. Such a fine tuner may also be useful in tuning out or rejecting interference in some situations. The fine tuning adjustment is generally of the continuously variable type and the adjustment therefor may also be mechanically coupled to associated UHF tuning apparatus, also of the continuously variable type, which can be tuned without a separate control. Thus, in complete tuning apparatus one switch knob may be used for selecting channels 2–13 and a second knob may be used for fine tuning of these channels. The second knob may also be used to operate the mechanism for tuning channels 14–83.

Some present day television receivers include, in addition to suitable knobs for manual operation of the tuning mechanism, a motor drive for the tuning mechanism which is controllable from a remote position. Accordingly, it may be seen that if the receiver is tuned to a channel and the fine tuner is also adjusted to a particular setting, then if the remote control mechanism is used to select a different channel, the fine tuner should, in most cases, not remain adjusted as it was for the previously tuned channel. Generally, of course, the tuning apparatus is aligned so that signals are properly selected when the fine tuner is at its mid-range setting and fine tuning is not needed for best reception of all channels. But in any event, better reception will generally be obtained on a given channel when the fine tuner is set at a center position than if it remains on another setting which happened to be required when the receiver was tuned to some other channel. Accordingly, it is an object of this invention to provide channel selecting apparatus having a separate fine tuner adjustment therefor which automatically returns to a center position when the apparatus is operated to selected a different channel.

Another object is to provide remotely controlled tuning apparatus for a television receiver which apparatus automatically resets a fine tuner device associated therewith to a mid-range setting when the apparatus is operated so that a previous setting thereof will not impair the receiver performance as different channels are selected.

Another object is to provide improved signal tuning apparatus including a fine tuner provision which returns automatically to a given setting when the apparatus is operated and wherein the fine tuner mechanism requires but few component parts, is of comparatively simple construction and does not impair the electrical characteristics of the tuning apparatus.

A feature of the invention is the provision of an improved fine tuner for signal tuning apparatus including a disengageable linking mechanism coupling the fine tuner to an operating shaft therefor, a spring for biasing the fine tuner to a mid-range thereof and simple mechanism responsive to a change of setting of the signal tuning apparatus to disengage the linking mechanism so that the spring can return the fine tuner to its mid-range setting.

Another feature of the invention is the provision of an automatically resetting fine tuner for the channel selector of a television receiver which tuner is spring biased to a mid-setting and which includes a sector rotatable to operate the fine tuner. The sector is engageable with a friction wheel turned by a knob available for operation of the fine tuner. The friction wheel is movable out of engagement with the sector by a slidable member moved by cams on a disc which is turned by the shaft of the main channel selector so that the fine tuner is spring biased to its mid-position setting when the channel selector is adjusted.

Further objects, features and the attending advantages of the invention will be apparent upon consideration of the following description when taken in conjunction with the accompanying drawings, in which.

In the preferred form, the invention comprises television tuning apparatus with a fine tuner provision which returns to a selected setting when channel selecting apparatus is operated from the channel to channel. A sleeve, rotatable to adjust the fine tuner, is disposed concentrically with a shaft of a switch for the channel selecting apparatus. A friction wheel, rotatable with the sleeve, is spring biased into engagement with a rotatable sector which controls a movable plate forming the rotor of a condenser acting as the variable provision of the fine tuner. The switch shaft carries a disc having cam surfaces engageable with a member which is movable when engaged by a cam surface so as to slide the friction wheel against the spring bias thereof and out of engagement with the rotatable sector. The condenser rotor and the sector are spring biased to a mid-position setting and the cam disc is positioned on the switch shaft so that in turning the shaft to select a channel the friction wheel is freed from the sector and the fine tuner condenser is moved to its mid-position setting.

Alternatively the frictional engagement may be between a radially movable wheel which drives the fine tuner, or a disengageable gear drive may be used.

Figures 1, 2, 3:
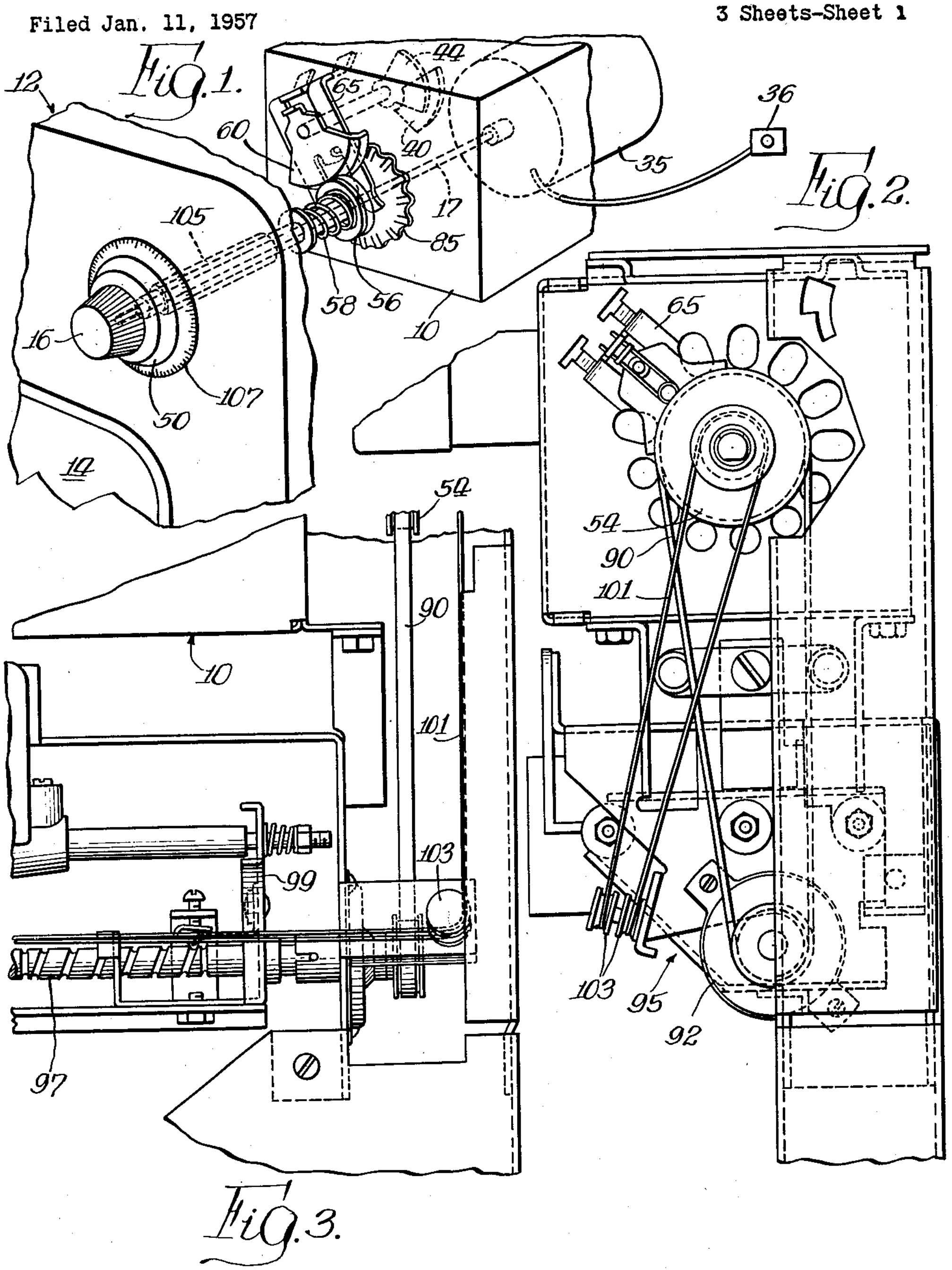
Fig. 1 is a perspective representation of a portion of a television receiver incorporating the invention.
Fig. 2 is a front elevation view showing UHF and VHF tuners for a television receiver.
Fig. 3 is a side elevational view of a portion of Fig. 2.
Figures 4, 5, 6:
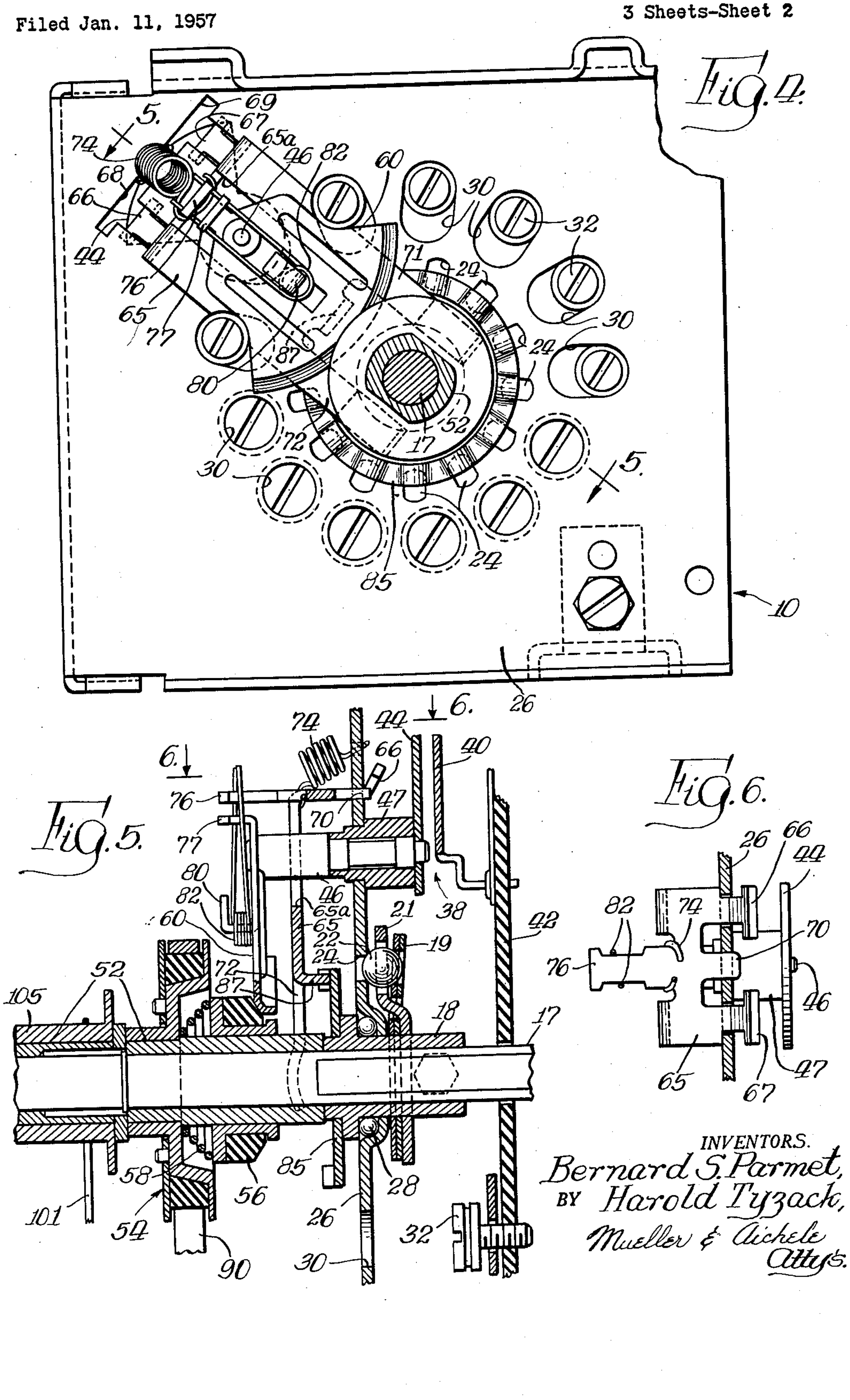
Fig. 4 is a front elevation view of the UHF tuner of Fig. 2.
Fig. 5 is a sectional view along the line 5—5 of Fig. 4.
Fig. 6 is a sectional view along the line 6—6 of Fig. 5.

Reference may be had to Fig. 1 for a simplified perspective view of the preferred form of the invention and to Figs. 2–6 for a more detailed illustration of the construction of an embodiment. The television tuning apparatus 10 is shown disposed in the upper right hand portion of a television receiver 12 having a picture viewing screen 14. The tuning apparatus 10 includes a 13-position switch (not shown in its entirety) of the detenting type which is operated by means of knob 16. This knob rotates shaft 17 to which is affixed a bearing sleeve 18 (Fig. 5) carrying spring member 19 and ball retaining member 21. Member 21 includes an aperture in which is captured a ball 22 which is biased by spring member 19 into one of the apertures 24 in the front panel 26 of a housing shield for the tuning apparatus. As shaft 17 is rotated ball 22 drops into one of the apertures 24 to provide detenting action. Suitable ball bearings 28 are disposed between bearing sleeve 18 and panel 26 for smoother action of the 13-position switch. Panel 26 also includes a series of apertures 30 through which trimmer adjustments 32 are available. These adjustments, as known in the art, are associated with the resonant circuits of the tuning apparatus to provide peaking of the local oscillator circuit for each channel to which the apparatus is tuned. These adjustments are generally made during assembly and once established are not altered except on further servicing of the receiver. The tuning apparatus further includes an electric motor 35 coupled to shaft 17 in order to drive the switch to its various positions. This motor may be remotely operated by a control generally indicated as 36 so that the receiver can be tuned by a viewer who may remain in his viewing position while operating the tuner. It is contemplated that motor 35 also includes suitable gear reduction apparatus so that a desirable tuning speed is obtained.

Fine tuning for the apparatus is provided by a variable condenser 38, having a stator plate 40, supported on insulating panel 42 within the tuning apparatus 10. Condenser 38 also includes a rotor plate 44 fastened to shaft 46 which is supported in a bearing sleeve 47 affixed to panel 26. Sleeve 47 and shaft 46 are stopped to prevent axial movement of plate 44 and undesired changes in the capacity of condenser 38. Condenser 38 is connected to the tuning apparatus in a known manner so that rotation of shaft 46 moves a given area of rotor-plate 44 opposite a corresponding area of stator plate 40. It is contemplated that variable provisions 32 be adjusted with condenser 38 at its mid-range position and that thereafter during use of the receiver any slight peaking of the tuning one each channel may be made by adjustment of condenser 38 for so-called fine tuning purposes.

A control knob 50, mounted concentrically with knob 16, is available from the front of the receiver to rotate sleeve 52 which is disposed concentrically with respect to shaft 17. Sleeve 52 carries a pulley 54 and a friction wheel 56 which is slidable along sleeve 52. Wheel 56 is spring biased by spring 58, which bears against pulley 54, into engagement with sector 60. Sector 60 is ribbed for strength and is affixed to the end of shaft 46 so that when sleeve 52 is rotated friction wheel 56 will turn causing rotation of sector 60 and positioning of rotor plate 44.

A movable member 65 is supported on panel 26 by means of a pair of bent lug portions 66, 67 which, during assembly of the device, are inserted within apertures 68, 69 and then moved into a restricted portion of apertures 68, 69 so that projections of lugs 61 and 62 support member 65. Projection 70 also supports member 65 by engaging a receiving aperture in panel 26. Member 65 has a cut out portion 65*a* through which shaft 46 extends. The other end of member 65 is forked and includes arms 71, 72 extending on either side of sleeve 52 and facing friction wheel 56. A tension spring 74, hooked to projection 76, biases member 65 toward panel 26 and in a direction away from friction wheel 56.

At the end of member 65 which is supported by panel 26, there is a projection 76 which is disposed in spaced relation from a similar projection 77 comprising a part of sector 60 on the opposite side of shaft 46 with respect to the sector. Sector 60 also includes a hooked portion 80 around which is disposed a coil spring 82 having arms under tension toward one another and extending across the axis of shaft 46 and on opposite sides of projections 76 and 77. Accordingly, it may be seen that by pivoting or sliding member 65 to the left in Fig. 5 the forked arms 71, 72 will engage friction wheel 56 and slide the same out of engagement with sector 60 and, that when the sector is freed, spring 82 will tend to return the sector as well as rotor plate 44 to a setting of equal tension of the extended arms of spring 82. This condition will, of course, be at the mid position setting of condenser 38, that is, where rotation of rotor plate 44 in one direction will increase the capacity of this condenser and rotation thereof in the opposite direction will decrease the capacity thereof.

In order to move forked arms 71, 72 into engagement with friction wheel 56, a cam bearing disc 85 is affixed to bearing sleeve 18 so that this disc is rotatable with shaft 17. A projection 87 from member 65 extends into engagement with the surface of disc 85 the cams of which may be formed by alternate depressions and rises which are coordinated with the detenting positions of shaft 17 so that projection 87 is moved outwardly from panel 26 and into engagement with friction wheel 56 when shaft 17 is positioned between a detented setting thereof. Thus, it may be seen that if the fine tuner is positioned at other than its mid setting when a new channel is selected by rotation of shaft 17, member 65 will move friction wheel 58 out of engagement with sector 60 to free the rotor plate 44 and sector 60, which will then be spring biased back to its mid position setting. It may further be seen that as shaft 17 is again detented member 65 will move out of engagement with friction wheel 56 which will then be spring biased back into engagement with sector 60 so that fine tuning control is again available by manipulating knob 50.

The surface of friction wheel 56 which bears against sector 60 is formed of a resilient material to provide a desirable driving contact. The periphery of sector 60 is arcuate and, upon sufficient rotation thereof, the end of the arc will be positioned at the contact point of friction wheel 56. Then further rotation of sleeve 52 will not affect the fine tuning mechanism. However, upon reverse rotation of sleeve 52 spring 82 will bias sector 60 to a driving engagement and the device may be operated to a similar condition at the opposite end of the periphery of the sector. Accordingly, since sleeve 52 may be freely rotated without causing disengagement of the driving mechanism (due to spring 82) this sleeve may also be used to drive a UHF tuner. Pulley 54 (Fig. 2) is coupled by means of belt 90 to the planetary drive 92 of a UHF tuner 95. This tuner includes a rotatable shaft 97 having a screw thread in the surface thereof which engages a slidable carriage 99 which is affixed to other elements of the UHF tuning apparatus not material to this invention. As a dial indication of the setting of tuner 95, cord 101 is looped around idler pulleys 103 from the tuner and looped over the sleeve 105 (Fig. 5) which is concentric with, and rotatable about, sleeve 52. This sleeve may be affixed to a suitable rotating dial 107 which is positioned behind the fine tuning adjustment knob 50 and visible from the front of the receiver.

Figures 7, 8, 9:
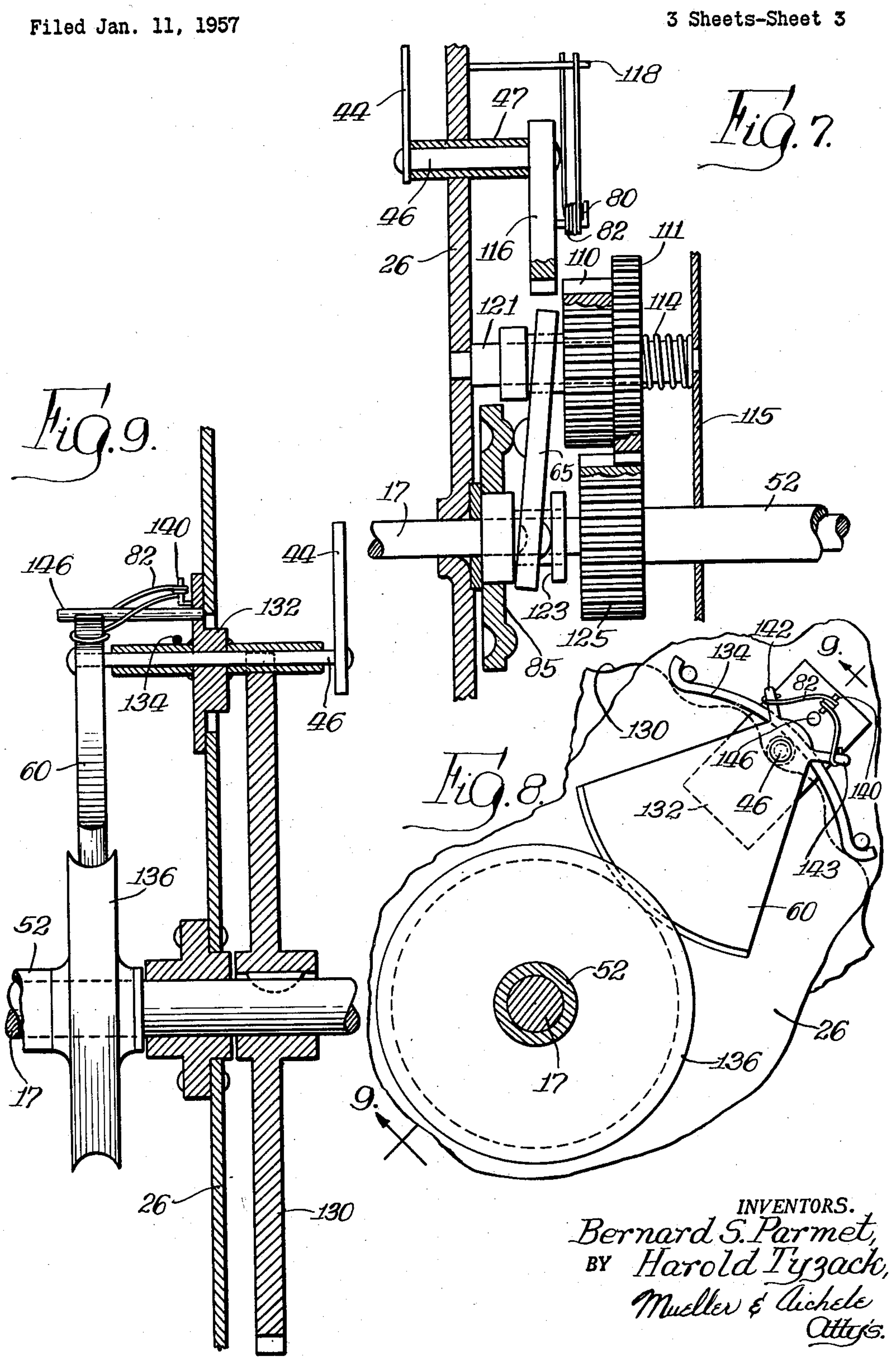
Fig. 7 is a sectional elevation view of a portion of a tuner incorporating a modified form of the invention.
Fig. 8 is a front elevation view of a further modified form of the invention.
Fig. 9 is a sectional view along the line 9—9 of Fig. 8.

Fig. 7 shows a modified form of the invention wherein a gear drive is used for operating the fine tuner. Elements corresponding with those of the previously described embodiment are given the same reference numerals. In the illustrated condition of the apparatus, shaft 17 is positioned intermediate a detented setting thereof and cam bearing disc 85, rotatable therewith, is engaged with member 65 to force gears 110 and 111 to the right in Fig. 7 and against spring 114 which bears on plate 115. This disengages gear 110 from gear segment 116 which is affixed to shaft 46 for controlling rotor plate 44. With segment 116 freed the extended arms of spring 82, which is carried by hook 80 of segment 116, will return the rotor to a mid-position setting as these arms bear against projection 118 extending outwardly from the panel 26. Shaft 46 is supported in sleeve 47 which prevents axial movement thereof.

When shaft 17 has been further rotated the raised cam surfaces of disc 85 and member 65 will be displaced with respect to one another so that spring 114 can move gears 110 and 111 to the left with gear 110 in engagement with gear segment 116. In this form of the invention member 65 is forked to extend on opposite sides of axle 121 about which gears 110 and 111 rotate and is also forked to encircle the grooved hub 123, integral with disc 85, to be guided thereby. Sleeve 52 is affixed to gear 125 which engages gear 111 in either the engaged or disengaged position of gear 110 so that when gear 110 is engaged with gear signal 116 rotor plate 44 can be positioned.

Figs. 8 and 9 show a further embodiment of the invention in which components corresponding to those of the previously described embodiments are given the same reference numerals. In this form of the invention a shuttle 132 is moved radially to open the friction drive of segment 60. Shaft 18 carries a disc 130 the periphery of which comprises a series of raised portions one of which engages shuttle 132 each time the tuning apparatus is moved from one detented position to another. Shuttle 132 includes a sleeve 133 extending through an aperture of panel 26 which sleeve supports shaft 46. The shuttle is retained on panel 26 and biased by means of spring 134 so that segment 60 is engaged with friction wheel 136. Thus rotation of sleeve 52 will turn segment 60 and rotor plate 44 which are affixed to one another by means of shaft 46. However, when shaft 17 is turned, a raised portion of disc 130 will engage a portion of slidable shuttle 132 so that the same is raised and segment 60 is spaced from friction wheel 36. A spring 82, fastened to hook 140 on shuttle 132, includes a pair of arms biased inwardly and hooked around projections 142 and 143 of segment 60 so that when this segment is freed from wheel 136, rotor plate 44 is returned to a mid-position setting. Peg 146 provides a stop which is engaged by projections 142 and 143 to limit rotation of segment 60.

Accordingly, the invention provides a fine tuner for the tuning apparatus of a television receiver which automatically returns to a given neutral setting whenever the channel selector of the apparatus is operated. The invention finds particular utility in television receivers of the remotely controlled type wherein it may be inconvenient to adjust the fine tuner as the receiver is remotely tuned to different channels. By using the invention any previous adjustment of the fine tuner will not be maintained when a new channel is selected, thereby preventing impairment of reception which might exist if the previous adjustment of the fine tuner were not proper for the newly selected channel. The fine tuner as shown and described requires but few additional components over the conventional type without restoring action and the control for the fine tuner is well adapted for additionally driving a UHF tuner which may be incorporated with the receiver.

What is claimed is:

1. A tuner for wave signals including in combination, tuning apparatus including a multi-position channel selecting device having a rotatable shaft for selecting anyone of a plurality of channels within a given frequency range, variable fine tuning means electrically coupled to said tuning apparatus and operable to vary the tuned frequency thereof by an amount small compared to said given range, a sleeve rotatable about said shaft, disengageable drive means having a portion displaceable with respect to said sleeve and engageable with said fine tuning means to drive the same, said sleeve being adapted to operate said fine tuning means through a frequency range on opposite sides of a mid-range setting thereof, spring means biasing said fine tuning means to said mid-range setting, and cam means operated by said rotatable shaft and engageable with said drive means for disengaging said fine tuning means so that said fine tuning means returns to said mid-range setting as said tuning apparatus is operated.

2. The tuner of claim 1 wherein said disengageable drive means includes a spring, said portion of said disengageable drive means is a disc biased by said spring into frictional engagement with said fine tuning means, and said cam means disengages said disc and said fine tuning means as said apparatus is operated and said spring thereafter returns said disc into engagement with said fine tuning means.

3. The tuner of claim 1 wherein said disengageable drive means includes a spring, said portion of said disengageable drive means is a gear train with a gear thereof biased by said spring into driving engagement with said fine tuning means, and said cam means disengages said gear train and said fine tuning means as said apparatus is operated and said spring thereafter returns said gear train into driving engagement with said fine tuning means.

4. The tuner of claim 1 wherein said disengageable drive means includes a disc frictionally engageable with said fine tuning means, said fine tuning means is supported by bearing means slidable outwardly from said disc to be disengaged therefrom, a spring for biasing said bearing means toward said disc with said fine tuning means in engagement with said disc, and said cam means engages said bearing means upon operation of said tuner to disengage said disc and said fine tuning means.

5. A wave signal tuner including in combination, tuning apparatus with a rotatable shaft for selecting signals, a sleeve rotatable about said shaft, a friction wheel rotatable with said sleeve and slidable therealong to first and second positions, first spring means biasing said friction wheel to said first position, a forked member having arms slidable into engagement with said friction wheel to slide the same to said second position, a cam disc carried by said shaft and having projecting portions engageable with said forked member to slide the same and to slide said friction wheel to said second position when said shaft is rotated, variable fine tuning means for said tuning apparatus including a rotatable sector for adjusting the same, said sector being in frictional engagement with said friction wheel when the same is in said first position and being out of engagement therewith when the same is in said second position, and second spring means biasing said fine tuning means to an intermediate setting thereof whereby said fine tuning means may be operated by rotation of said sleeve and is returned to said intermediate setting thereof when said shaft of said tuning apparatus is operated.

6. A wave signal tuner including in combination, tuning apparatus with a rotatable shaft for selecting signals, a sleeve rotatable about said shaft, first gear means rotatable with said sleeve, second gear means engaged with said first gear means and axially slidable to first and second positions, first spring means biasing said second gear means to said first position, a forked member with arms slidable into engagement with said second gear means to slide the same to said second position, a cam disc carried by said shaft and having projecting portions engageable with said forked member to slide the same and slide said second gear means to said second position when said shaft is rotated, fine tuning means for said tuning apparatus including a rotatable gear sector for adjusting the same, said sector being in engagement with said second gear means when the same is in said first position and being out of engagement therewith when in said second position, and second spring means biasing said fine tuning means to an intermediate setting thereof whereby said fine tuning means may be operated by rotation of said sleeve and may be returned to said intermediate setting thereof when said shaft is operated.

7. A wave signal tuner including in combination, tuning apparatus with a rotatable shaft for selecting signals, a sleeve rotatable about said shaft, a friction wheel rotatable with said sleeve, bearing means adapted to slide radially outwardly from said friction wheel, spring means biasing said bearing means toward said friction wheel into a first position, a disc carried by said shaft and having projecting portions engageable with said bearing means to slide the same against said spring means and radially outwardly from said friction wheel and into a second position when said shaft is rotated, variable fine tuning means for said tuning apparatus, said fine tuning means being supported by said bearing means and including a rotatable sector for adjusting the same, said sector being in frictional engagement with said friction wheel when said bearing means is in said first position and being disengaged therefrom when said bearing means is in said second position, and spring means biasing said fine tuning means to an intermediate setting thereof whereby said fine tuning means may be operated by rotation of said sleeve and returned to said intermediate setting when said shaft of said tuning apparatus is operated.

8. Control mechanism for electronic apparatus including in combination, a first rotatable shaft for controlling an electronic component, variable means including a second rotatable shaft for controlling a further electronic component, a sleeve rotatable about said first shaft, a clutch mechanically coupling said sleeve to said second shaft, said clutch including spring means for biasing the same into an operative condition for driving said second shaft by said sleeve, further spring means biasing said variable means to a given setting, means driven by said first rotatable shaft including a plurality of cam portions engageable with said clutch to open the same when said first shaft is rotated, whereby said variable means returns to the given setting as said first rotatable shaft is operated.

References Cited in the file of this patent

UNITED STATES PATENTS

| | | |
|---|---|---|
| 2,791,124 | Gossard | May 7, 1957 |

FOREIGN PATENTS

| | | |
|---|---|---|
| 713,143 | Germany | Nov. 1, 1941 |